United States Patent
Riley

Patent Number: 5,856,911
Date of Patent: Jan. 5, 1999

[54] ATTACHMENT ASSEMBLY FOR INTEGRATED CIRCUITS

[75] Inventor: John B. Riley, Plano, Tex.

[73] Assignee: National Semiconductor Corporation, Santa Clara, Calif.

[21] Appl. No.: 747,347

[22] Filed: Nov. 12, 1996

[51] Int. Cl.⁶ ........................................................ H05K 7/20
[52] U.S. Cl. ........................... 361/704; 174/16.3; 257/707; 257/713; 257/720; 361/720
[58] Field of Search .................... 165/80.2, 80.3, 165/185; 174/16.3; 257/707, 711–713, 720, 687, 693, 697, 737–738, 780; 361/687, 704, 707, 709–710, 714–722

[56] References Cited

U.S. PATENT DOCUMENTS

| 5,285,352 | 2/1994 | Pastore | 257/712 |
| 5,513,070 | 4/1996 | Xie et al. | 361/720 |
| 5,541,450 | 7/1996 | Jones et al. | 257/697 |
| 5,559,675 | 9/1996 | Hsieh et al. | 361/720 |
| 5,583,377 | 12/1996 | Higgins, III | 257/713 |

FOREIGN PATENT DOCUMENTS

| 2058358 | 2/1990 | Japan | 257/712 |
| 4114455 | 4/1992 | Japan | 257/713 |

Primary Examiner—Gregory Thompson
Attorney, Agent, or Firm—John L. Maxin

[57] ABSTRACT

An integrated circuit package has a top die attach area and a bottom heat spreader thermally coupled to the die for conducting heat generated by the die through a thermal interface in the main circuit board to a heat sink or heat pipe mounted underneath the main circuit board. The preferred thermal interface is a thin, thermally conductive slug mounted through an opening formed in the main circuit board. The heat spreader spans the bottom surface of the integrated circuit package substantially parallel to the main circuit board and preferably extends substantially to the inner periphery of the pin arrangement which preferably, although not exclusively, is in a ball grid array. The opening formed in the main circuit board through which the thin, thermally conductive slug is fitted, is preferably substantially flush with the bottom surface of the main circuit board and juxtaposed against the heat spreader. A thermally conductive adhesive is preferably applied to the adjoining surfaces of the heat spreader and the slug.

14 Claims, 2 Drawing Sheets

ATTACHMENT ASSEMBLY FOR INTEGRATED CIRCUITS

BACKGROUND OF THE INVENTION

1. Field of the Invention

The invention relates generally to integrated circuit packages, and more specifically to an integrated circuit package having a top cavity die attach area while sinking heat through the bottom of the package.

2. Description of Related Art

Packages for integrated circuits have evolved over the years from the simplistic single and dual inline packages (SIP) and (DIP) respectively, through the more sophisticated and denser pin grid array (PGA), staggered pin grid array (SPGA), and ball grid array (BGA). The so-called tape carrier package (TCP) is used in small form-factor products such as laptop computers, due to its small footprint and low clearance characteristics. The TCP is produced through the so-called Tape Automated Bonding (TAB) process that is pervasive in portable electronics. An exemplary, but not exclusive application of the TCP can be found in the mobile Pentium® processor from the Intel Corporation of Santa Clara, Calif.

Referring now to FIG. 1, a TCP device 10 (such as the mobile Pentium® processor) is constructed from a flexible tape 12 that is laminated with a copper foil on its bottom. The flexible tape 12 has an opening 14 formed near its center for attachment of a die 15. The copper foil is photo-imaged and etched forming an arrangement of pads around the opening 14 with gold plated electrical traces extending therefrom to conductive fingers 16 formed at the outer borders of the tape 12. The fingers 16 are bent in a gull-winged fashion for attachment to a circuit board 18. Special "gold bumps" 25 are deposited on standard aluminum bond pads formed around the top periphery of the die 15. The gold bumps 25 are then attached to the arrangement of pads formed on the bottom of tape 12 through so-called thermal compression bonding. After the die 15 is attached, a blob of encapsulant such as polyimide siloxane 20 is applied to the opening 14 to protect and seal the die 15.

To attach the TCP 10, special tooling presses the gull-winged shaped fingers 16 to the circuit board 18 and applies heat to fuse the fingers 16 to pads formed on the circuit board 18. In its installed position, the bottom of the die 15 is directly attached with a thermally conductive adhesive 26 to the top of a plurality of thermal vias 22 (i.e. metal-plated through holes) formed through circuit board 18. The bottom of the thermal vias 22 are coupled to the top of the heat sink 24 through thermal plane 27 and thermal grease. The TCP device 10 sinks heat through its bottom due to its die 15 being in direct contact with thermal vias 22 on the circuit board 18, and ultimately through the heat sink 24 disposed underneath the circuit board 18. Alternatively, a heat pipe (not shown) could be coupled between the thermal plane 27 and a remotely located heat sink 24.

By way of further background, a standard Ball Grid Array (BGA) package (not shown) is a piece of "circuit board-like" planar laminate material (however much thicker and sturdier than the TCP tape) with its bottom (i.e. the side towards the main circuit board in its mounted position) having a die attach cavity formed thereon with electrical traces etched from the die attach area to an array of solder balls (ergo BGA). After the die is affixed to the die attach area, the aluminum bond pads are bonded out to the etched traces on the laminate material by well known wire bond techniques and a resin encapsulant is applied over the die for protection. A thin piece of metal acting as a heat spreader is attached to the top of the BGA package and a heat sink is typically attached to the heat spreader to further dissipate heat.

The BGA device is attached to the main circuit board by placing it so that its solder balls are aligned with attachment pads formed on the main circuit board and passing the entire circuit board through an oven that re-flows the solder balls. The BGA package, which has a small footprint, low clearance, and is easier to install than the TCP, sinks heat through the top mounted heat spreader in contact with a top mounted heat sink—as is conventional with most integrated circuit packages. Consequently, a drawback with switching a design with a part having a TCP to a BGA package in a tight form-factor product (e.g. a laptop computer), is that it requires extensive mechanical and thermal changes to the internals of the product (e.g. case size, circuit board mounts, and heat sink/heat pipe designs).

Another drawback with the TCP is that it requires special tooling to: cut the assembly from the tape, form the leads into a gull wing like shape, and to place and solder the assembly onto the circuit board. Moreover, the thin flexible tape used as the substrate in a TCP is subject to warp under heat. Consequently, an attempt to adapt a TCP into a BGA arrangement is undesirable since standard re-flow soldering techniques would most likely warp the tape substrate thus skewing the solder balls off of the attachment pads—making attachment unreliable. Moreover, the attachment process becomes more complex and ostensibly more expensive if stiffeners are added to the tape substrate after the part is already formed and cut with the special TCP tooling.

Another drawback with TCP is the die is required to have special gold bumps deposited on its aluminum pads for thermal compression bonding—adding complexity and cost to the product.

Yet another drawback with the TCP is that the yield rates for successful circuit board installation are typically much lower as compared to more conventional packages such as the BGA since, among other things, the die which is brittle, is directly attached to the main circuit board which may be subject to twisting and shock.

Yet another drawback, particularly with devices which have high power consumption requirements such as a processor, is that heat is dissipated through thermal vias which are formed in the circuit board—potentially weakening or causing damage to surrounding components.

Accordingly, it can be seen from the foregoing, that there is a need for an alternative integrated circuit package that minimizes mechanical and thermal changes to systems originally designed for low profile TCP devices.

SUMMARY OF THE INVENTION

To overcome the limitations of the prior art described above, and to overcome other limitations that will become apparent upon reading and understanding the present specification, the present invention discloses an integrated circuit package having a top die attach area and a bottom heat spreader thermally coupled to the die, for conducting heat through the bottom of the die, through the main circuit board (preferably through a thin, thermally conductive slug mounted in an opening formed in the main circuit board), and ultimately through a heat sink or heat pipe to heat sink. The heat spreader spans the bottom surface of the package substantially parallel to the main circuit board and preferably extends substantially to the inner periphery of the pin arrangement which preferably, although not exclusively, is in a ball grid array.

The preferred embodiment has an opening formed in the main circuit board through which the thin, thermally conductive slug is fitted substantially flush with the bottom surface of the circuit board and juxtaposed against the heat spreader after the device is installed. A thermally conductive adhesive is preferably applied to adjoining surfaces of the heat spreader and the slug and between adjoining surfaces of the slug and the heat sink, respectively. The slug provides a thermal interface between the heat spreader and the heat sink or heat pipe mounted underneath the circuit board without substantially transferring any heat to the main circuit board.

A feature of the present invention is maintaining mechanical and thermal compatibility with exiting designs for TCP circuit layouts excepting or course, changes to the circuit board for the pin arrangements and preferably for the opening formed in the main circuit board to accommodate the slug.

Another feature of the present invention is the integrated circuit package of the present invention is easy to install and only requires standard BGA manufacturing equipment and processes.

Another feature of the present invention is that printed circuit board assembly yield rates are typically much higher for BGA devices than for TCP devices since the die is not directly affixed to the main circuit board.

These and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a specific example of an integrated circuit package in accordance with the principles of the present invention.

DESCRIPTION OF THE PREFERRED EMBODIMENTS

Reference is now made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
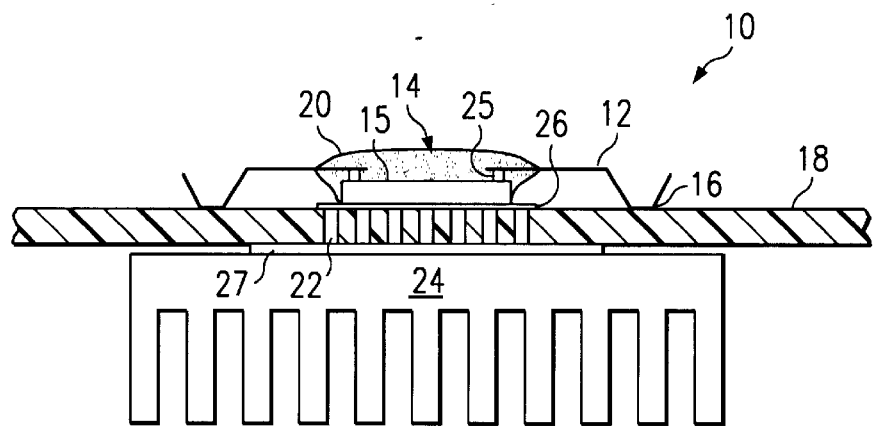
FIG. 1 is a cross sectional view of a prior art device employing a tape carrier package (TCP)
Figure 2:
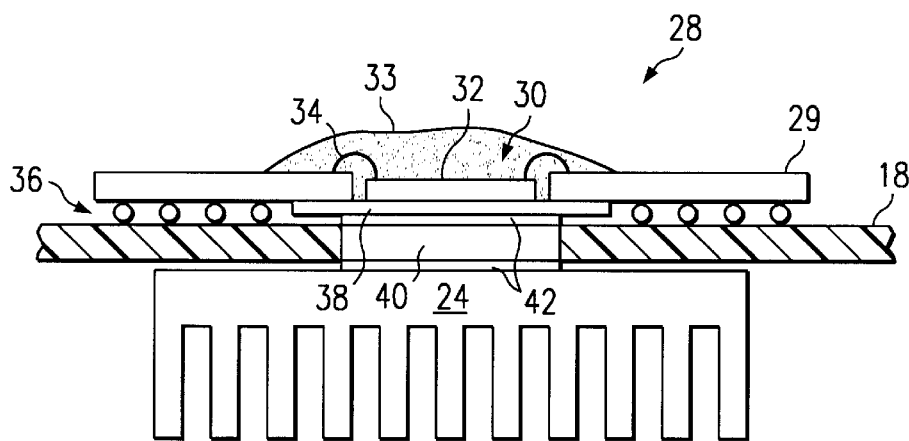
FIG. 2 is a cross sectional view of an integrated circuit package having a top die cavity and a bottom heat sink, practiced in accordance with the principles of the present invention.

Reference is now made to FIG. 2 which depicts a cross sectional view of an integrated circuit package 28 practiced in accordance with the principles of the present invention. A top cavity 30 for holding an integrated circuit die 32 is formed in a thin "circuit-board like" planar laminate material 29. The integrated circuit die 32 is bonded out with bond wires 34 to electrical traces (not shown) on top of the laminate material 29 and coupled through electrical vias (not shown) formed in the laminate material 29 to pint embodied solder balls 36 forming a ball grid array (BGA) on the bottom of the material 29. Depending on the pin density, the laminate material 29 may be multi-layered with traces running between layers for coupling the die 32 to solder balls 36. Those skilled in the art with the aid of the present disclosure, will recognize other configurations for the connections (pins) and (pin) arrangement other than BGA (e.g. PGA and SPGA) without departing from the scope of the present invention.

A heat spreader 38 preferably made of a thin piece of metal, is thermally coupled to the integrated circuit die 32 using thermally conductive adhesive 42 for dissipating heat through the bottom of the package 28. The heat spreader 38 spans the bottom surface of the planar material 29 substantially parallel to the main circuit board 18 and preferably extends substantially to the inner periphery of the BGA pin arrangement. The top cavity 30, the integrated circuit die 32, and the bond wires 34 are encapsulated with a resin 33 (e.g. polyimide siloxane) for protection.

The package 28 is placed on the circuit board 18 and passed through an oven to heat and re-flow the solder balls 36 for attachment to pads coupled to electrical traces formed on the circuit board 18. In the preferred embodiment, a thermally conductive slug 40 is then fitted through an opening 44 (FIGS. 3 and 4) formed in the circuit board 18 and coupled between the heat spreader 38 and the heat sink 24. A thin layer of thermally conductive adhesive 42 is preferably applied between the heat spreader 38 and the slug 40 and between the slug 40 and the heat sink 24. It should be understood that plated through thermal vias typically used with a TCP device, may be used in lieu of the thermally conductive slug 40 and the formation of the opening 44, without departing from the scope of the present invention.

Figure 3:
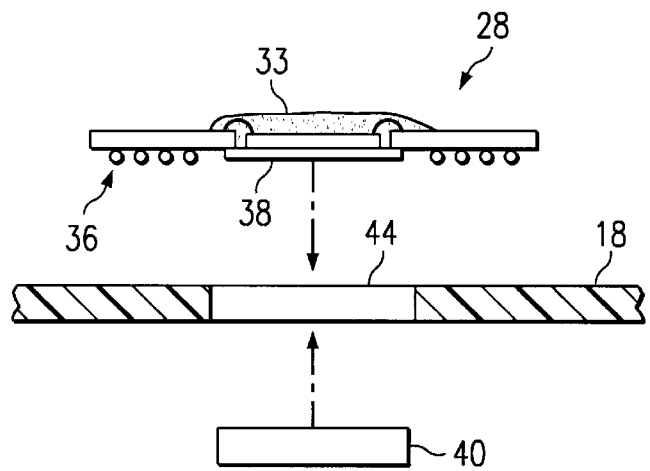
FIG. 3 is a cross sectional exploded view of the integrated circuit package depicted in FIG. 2.
Figure 4:
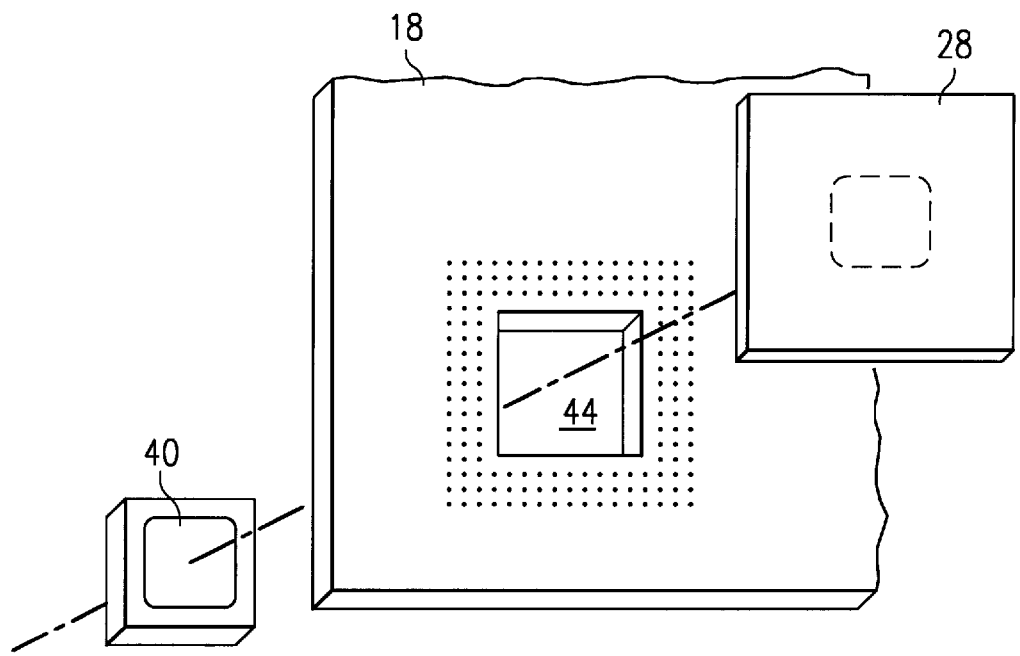
FIG. 4 is a perspective exploded view of the integrated circuit package depicted in FIG. 2; and, FIG. 5 is a side view of a typical, although not exclusive, application for the present invention.

Reference is now made to FIGS. 3 and 4 which depict a cross sectional exploded view of FIG. 2 and a perspective exploded view respectively, of the top cavity die attach area integrated circuit package 28 installed in a circuit board 18. While opening 44 in circuit board 18 may have a form factor larger than slug 40, it is preferably formed such that slug 40 snugly fits therein and so that its bottom is substantially planar and parallel with the top or bottom surfaces of circuit board 18. Heat spreader 38, which is thermally and mechanically coupled to the top of slug 40, preferably has a thickness that substantially spans to the top of the slug 40 after the solder balls 36 have been heated and attached to the electrical traces on circuit board 18.

Figure 5:
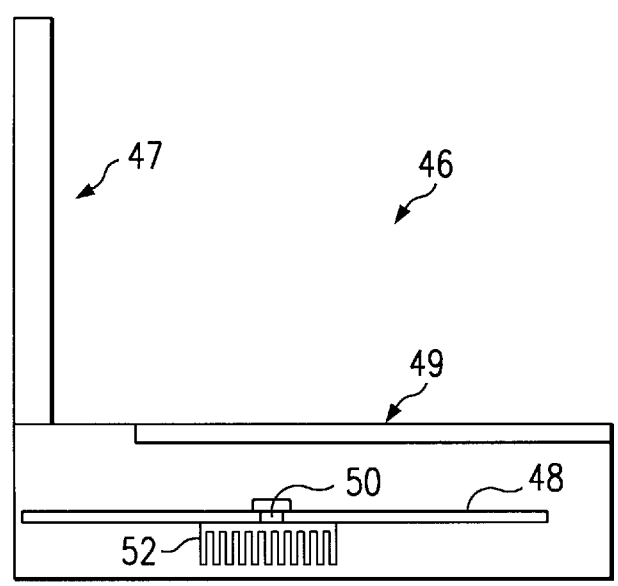

Reference is now made to FIG. 5 which depicts a side view of a typical, although not exclusive, application for the present invention. A portable (laptop) computer 46 includes a flat screen display 47, a keyboard 49, and a motherboard 48 having, inter alia, a processor 50 mounted on it in a package practiced in accordance with the principles of the present invention. While FIG. 5 depicts a heat sink 52 mounted below the motherboard 48, those skilled in the art with the aid of the present disclosure, will recognize other configurations (e.g. conducting the heat with a heat pipe to a remotely mounted heat sink 52, or reversing the orientation of the motherboard 48 so that heat sink 52 is below the keyboard 49), without departing from the scope of the present invention.

Although the Detailed Description of the invention has been directed to certain exemplary embodiments, various modifications of these embodiments, as well as alternative embodiments, will be suggested to those skilled in the art.

The invention encompasses any modifications or alternative embodiments that fall within the scope of the claims.

What is claimed is:

1. An assembly to attach an integrated circuit to a top surface of a circuit board and to a heat sink disposed under a bottom surface of the circuit board, the assembly comprising:

(a) an integrated circuit die;
   (b) an integrated circuit package including a planar material having a top and a bottom, a die attach cavity being formed therethrough for receiving the integrated circuit die, and a plurality of electrical traces being formed on the bottom, the electrical traces being coupled to an arrangement of pins on the bottom and to the integrated circuit die;
   (c) a heat spreader attached to the bottom of the integrated circuit package having a surface area at least as large as the die attach cavity, the integrated circuit die being attached to the heat spreader within the die attach cavity; and,
   (d) a thermally conductive slug coupled to the heat spreader and adapted to span through an opening formed in the circuit board.

2. An assembly as recited in claim 1 wherein the thermally conductive slug is adapted to snugly fit through the opening in the circuit board and is substantially flush with the bottom surface of the circuit board.

3. An assembly as recited in claim 1 further comprising a layer of thermally conductive adhesive between adjoining surfaces of the heat spreader and the thermally conductive slug.

4. An assembly as recited in claim 1 wherein the heat spreader spans substantially to an inner periphery of the arrangement of pins.

5. An assembly as recited in claim 1 wherein the arrangement of pins is a ball grid array.

6. An assembly to attach an integrated circuit to a top surface of a circuit board and to a heat sink disposed beneath a bottom surface of the circuit board, the assembly comprising:

(a) an integrated circuit die;
   (b) a package including laminate means having a die attach cavity formed therethrough for holding the integrated circuit die and electrical connection means for coupling the integrated circuit die to an arrangement of pins on a bottom of the package;
   (c) heat spreader means for thermally spreading heat generated by the integrated circuit die, coupled to the bottom of the package and having a surface area at least as large as the die attach cavity, the integrated circuit die being attached to the heat spreader within the die attach cavity; and,
   (d) thermally conductive slug means, coupled to the heat spreader means and adapted to span through an opening formed in the circuit board, for thermally interfacing the integrated circuit die to the heat sink.

7. An assembly as recited in claim 6 further comprising thermally conductive adhesive means for coupling the heat spreader means and the thermally conductive slug means.

8. An assembly as recited in claim 7 wherein the thermally conductive slug means is adapted to snugly fit through the opening in the circuit board and is substantially flush with the bottom surface of the circuit board.

9. An assembly as recited in claim 6 wherein the heat spreader means is a thin piece of metal.

10. An assembly as recited in claim 6 wherein the arrangement of pins is a ball grid array.

11. A method of attaching an integrated circuit to a circuit board top and to a heat sink disposed below the circuit board bottom, comprising steps of:

(a) mounting an integrated circuit die within a die attach cavity formed through a planar material to a heat spreader attached to the bottom of the planar material, the heat spreader having a surface area at least as large as the die attach cavity;
    (b) bonding the integrated circuit die to a plurality of electrical traces formed on the planar material and coupling the electrical traces to an arrangement of pins formed on a bottom of the planar material; and,
    (c) thermally coupling the integrated circuit die with the heat spreader through an opening formed in the circuit board to the heat sink disposed below the circuit board bottom.

12. A method as recited in claim 11 further comprising a step of applying a layer of thermally conductive adhesive to the heat spreader.

13. A method as recited in claim 11 wherein step (c) comprises a step of inserting a thermally conductive slug through the opening formed in the circuit board between the heat spreader and the heat sink.

14. In a low profile product having a circuit board and a heat sink disposed below the circuit board bottom, an assembly to attach an integrated circuit to the circuit board top and to the heat sink, comprising:

(a) an integrated circuit die;
    (b) a package including a planar material having a top, a bottom, a die attach cavity being formed therethrough for receiving the integrated circuit die, and a plurality of electrical traces being formed on the bottom, the electrical traces being coupled to an arrangement of pins on the bottom and to the integrated circuit die;
    (c) a heat spreader attached to the bottom of the package having a surface area at least as large as the die attach cavity, the integrated circuit die being attached within the die attach cavity to the heat spreader; and,
    (d) a thermally conductive slug coupled to the heat spreader and adapted to pass through an opening formed in the circuit board and couple to the heat sink disposed below the circuit board bottom.

* * * * *